Jan. 16, 1962 B. BIRKENES 3,017,507

HYBRID RADIO RECEIVER

Original Filed Oct. 12, 1956

INVENTOR.
BERNHARD BIRKENES

BY Mueller & Aichele

ATTYS.

3,017,507

HYBRID RADIO RECEIVER

Bernhard Birkenes, Chicago, Ill., assignor to Motorola, Inc., Chicago, Ill., a corporation of Illinois Continuation of application Ser. No. 615,690, Oct. 12, 1956. This application Jan. 29, 1959, Ser. No. 789,923
8 Claims. (Cl. 250—20)

This invention relates to radio receivers, and more particularly to automobile radio receivers of a hybrid type including vacuum tube and transistor amplifier stages operated directly by the battery-generator voltage supply. This application is a continuation of application Serial No. 615,690, filed October 12, 1956.

With the advent of transistors, low voltage radio receivers for automobiles or the like operable directly from the nominal 12-volt D.C. battery-generator power supply of the automobiles are possible. However, the operation of vacuum tube stages at low voltage has created some problems in providing sufficient gain per stage. Also there has been difficulty in handling signals of widely varying strengths without distortion. A further problem has been to provide automatic volume controls effective at high signal levels while not reducing the gain at low signal levels.

An object of the invention is to provide an improved radio receiver of the hybrid type.

Another object of the invention is to provide an improved hybrid radio receiver having vacuum tube amplification stages operating at low voltage.

A further object of the invention is to provide radio receivers having intermediate frequency amplifier stages having high gain.

Another object of the invention is to provide a low voltage radio receiver providing operation with low distortion during wide variations in received signal level.

A still further object of the invention is to provide radio receivers having new and improved automatic volume control circuits.

One feature of the invention is the provision of a low voltage radio receiver wherein the various stages are constructed to have maximum gain with minimum distortion.

Another feature of the invention is the provision of a low voltage radio receiver having an intermediate frequency stage in which the suppressor grid is biased relative to the cathode by an unbypassed resistor to increase the gain of the stage. The suppressor grid of the radio frequency amplifier stage may also be connected to signal ground through an unbypassed resistor to prevent distortion when high level signals are received.

A further feature of the invention is the provision of a delayed automatic volume control for a radio receiver in which B+ voltage is supplied to the automatic volume control line through a bleeder resistor to increase the sensitivity of a controlled stage at low signal levels.

A still further feature of the invention is the provision of a radio receiver of the hybrid type having an automatic gain control system providing gain control voltages of proper levels to the radio frequency, intermediate frequency and audio frequency amplifiers of the receiver.

Referring now to the drawings.

Figures 1, 2, 3:
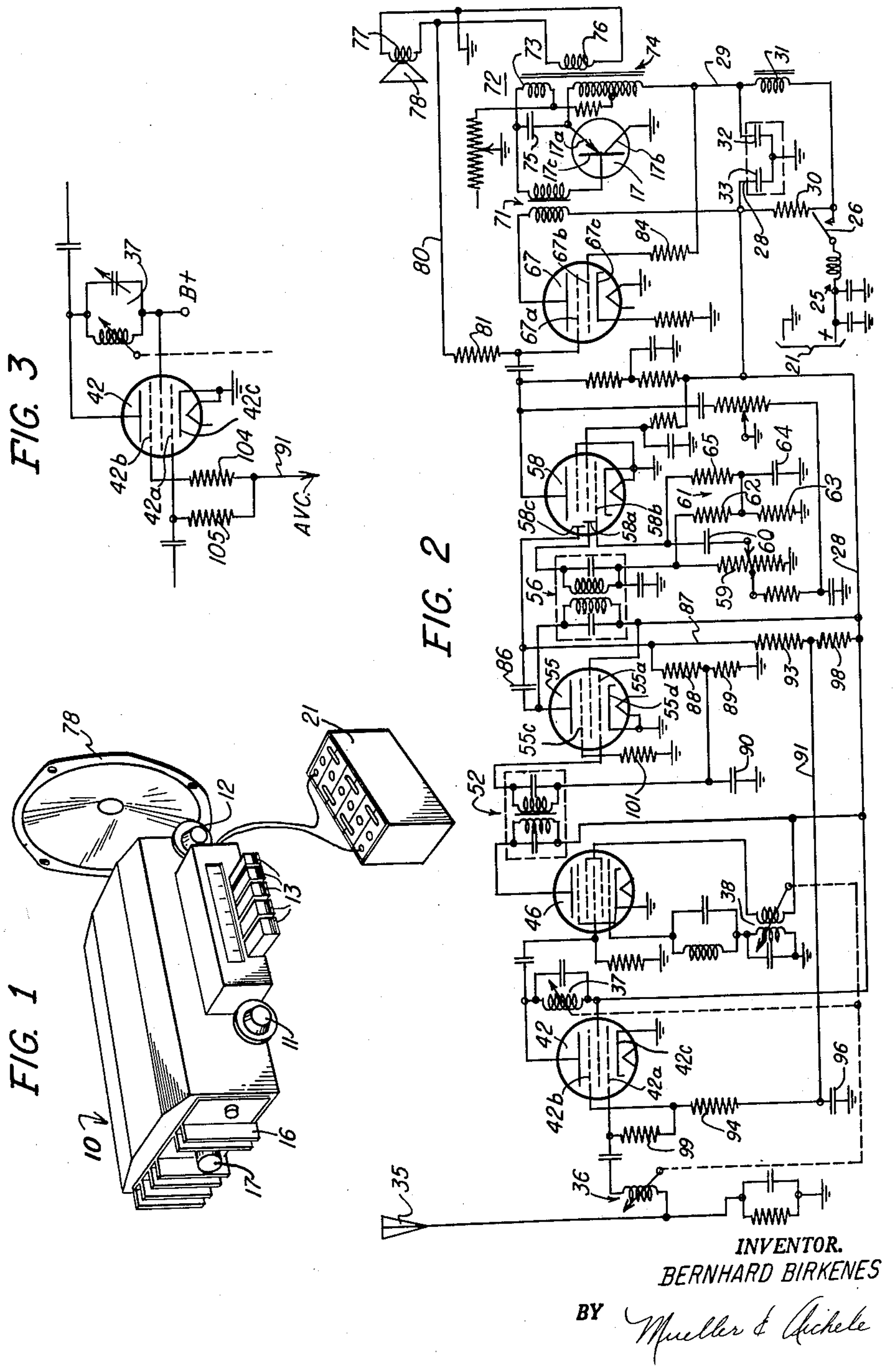
FIG. 1 is a perspective view of a radio receiver forming one embodiment of the invention.
FIG. 2 is a circuit diagram of the radio receiver shown in FIG. 1.
FIG. 3 is a circuit diagram of an alternate circuit for the radio receiver of the invention.

The invention provides a radio receiver operable directly from the battery-generator voltage of an automobile, without voltage step up. The receiver includes a radio frequency amplifier vacuum tube stage, a mixer oscillator vacuum tube stage and an intermediate frequency amplifier vacuum tube stage which feeds a signal to a detector. Audio frequency amplifier and audio driver vacuum tube stages and a transistor power amplifier stage feeding a loudspeaker also are provided. An automatic valume control line receives its A.V.C. voltage from the detector stage and applies the voltage to various stages with the voltage being applied through suitable resistors to a suppressor grid of the radio frequency amplifier stage. A bleeder resistor is provided from B+ to the automatic volume control line to provide the required bias for maximum tube gain at low signal levels. The automatic volume control voltage is reduced somewhat as it is applied to the intermediate frequency amplifier stage to keep the gain of this stage high. The gain of the intermediate frequency stage also is kept high by providing an unbypassed resistor between the cathode and the suppressor. A similar resistor is connected from the suppressor grid of the radio frequency amplifier stage to signal ground to reduce distortion at high signal levels. A separate gain control portion provides a gain control voltage to the audio frequency amplifier tube stage.

There is shown in FIG. 1 an automobile radio receiver 10 provided with control knobs 11 and 12 and tuning push-buttons 13. A heat sink 16 is mounted on the side of the housing 10, and a transistor 17 is mounted on the heat sink in heat-conductive relationship therewith. The radio receiver directly utilizes the voltage of the automobile electrical system which is provided by the battery 21 of an automobile, and a generator (not shown) for charging the same. The battery supplies nominally 12-volt D.C., which may vary from about 9 volts to about 16 volts during operation of the automobile.

In FIG. 2 there is shown the complete circuit diagram of the receiver of the invention. Voltage from the automobile source 21 is applied to the radio circuit through filter 25, a manually operable switch 26 and further filters including resistor 30, choke coil 31 and capacitors 32 and 33. The line 29 supplies screen voltage to an audio stage 67 and power to transistor power amplifier stage 72. The line 28 supplies power to the rest of the radio receiver.

An antenna 35 supplies modulated radio frequency signals to a tuned circuit 36 gang-tuned with a tuned circuit 37 and an oscillator circuit 38. The modulated radio frequency signal is fed from the tuned circuit 36 to the grid of radio frequency amplifier vacuum tube stage 42. The output of the stage 42 is tuned by circuit 37 and the signal is applied therefrom to control grid of a mixer-oscillator vacuum tube stage 46. Local oscillations in the stage 46 are controlled by oscillator circuit 38, and the stage converts the modulated radio frequency to a modulated intermediate frequency of, for example, 262.5 kilocycles per second.

The stage 46 feeds its intermediate frequency output through tuned circuit 52 to the control grid of intermediate frequency amplifier vacuum tube stage 55. The stage 55 transmits its output through tuned circuit 56 to diode plate 58*a* of a detector-automatic volume control-audio frequency amplifier vacuum tube stage 58. The audio frequency signal is developed across volume control potentiometer 59, and a controlled portion of the detected audio signal is fed through capacitor 60 to the control grid 58*b* of the stage 58 and is amplified therein by stage 58.

Automatic gain control for the tube 58 is provided by network 61. The detected voltage is applied across resistors 62 and 63 which divide down the voltage. The capacitor 64 bypasses the audio frequencies and the gain control potential is developed thereacross. Resistor 62 and capacitor 64 form a filter for providing the gain control potential. The gain control is applied through resistor 65 to the control grid 58*b* of tube 58.

The output of stage 58 is applied to the control grid 67*a* of the audio driver vacuum tube 67. The tube 67 is connected in a space charge type circuit with a grid 67*b*, connected to a positive potential, positioned between the control grid 67*a* and the cathode 67*c*.

The output of the tube 67 is fed through a transformer 71 to the input of the transistor power amplifier stage 72, being applied between the base electrode 17*c* and an emitter electrode 17*a*. The transistor 17 has an output circuit including the emitter electrode 17*a* and collector electrode 17*b* and provides output current through the primary winding of transformer 74 in proportion to voltage supplied to the input circuit. A secondary winding 76 of the transformer supplies power to a voice coil 77 of a loudspeaker 78, and a resistor 81 provides negative feedback to the grid 67*a*. Bias is applied to the base electrode 17*c* through tertiary winding 73 of transformer 74, which feeds back signals to the input to reduce the negative feedback from the primary winding of the transformer. A large coupling capacitor 75 is provided between input transformer 71 and the emitter electrode 17*a* to prevent loss of the input signal.

The diode plate 58*c* develops a direct current automatic volume control voltage for the preceding stages 42 and 45. When there is no signal supplied to the stage 55, contact potential of the plate 58*c* causes current flow through resistors 88 and 89, to the cathode of tube 58. This develops a negative voltage across resistors 88 and 89, and appearing on line 87, which may be of the order of −0.5 volt, and this is higher than desired for full gain operation of the radio frequency stage 42 at low signal levels. To counteract this, resistor 93 and a large bleeder resistor 98 are connected in series from the B+ line 28 to the line 87. The relative values of the resistors 93 and 98 are such that the negative voltage which would be applied to line 91 in the absence of the resistor 98 is reduced to a negative voltage of the order of −0.2 volt D.C. Thus the effect of the bleeder connection to B+, for example, is to reduce the bias on the radio frequency amplifier stage 42, and during the reception of weak signals, the gain of the stage 42 is maximum. During reception of strong signals, the high A.V.C. voltage developed from the signals transmitted through the capacitor 86 overrides the effect of the bleeder resistor 98 and effectively reduces the gain of the radio frequency stage 42. A capacitor 96 and the resistor 93 form a filter which removes radio and audio frequency signals and provides the desired time constant to the A.V.C. circuit.

The A.V.C. line 91 is connected to the control grid 42*a* of stage 42 through resistors 94 and 99 and to the suppressor grid 42*b* through resistor 94. The effect of connecting the suppressor 42*b* to the A.V.C. line 91 through the resistor 94 (rather than, conventionally, to a cathode 42*c* of the tube 42) is to make the tube 42 operative through a wide range of signals applied thereto without providing objectionable distortion. Resistor 94 is not bypassed and connects the suppressor grid 42*b* to signal ground. The use of this resistor, which forms a direct current impedance between the suppressor grid and signal ground, is believed to increase the control grid-to-plate capacitance on strong signals so that distortion is prevented.

Only a portion of the automatic volume control voltage is applied to the grid of the intermediate frequency amplifier stage 55 because of the dropping effect of the voltage-divider circuit formed by the resistors 88 and 89. Capacitor 90 forms a filter with the resistor 88 to smooth out the automatic volume control voltage. Thus, it will be noted that only a portion of the full automatic volume control voltage present on the lines 87 and 91 during higher signal levels, when the voltage provided by the bleeder resistor 98 is overcome, is applied to the stage 55.

In order to enhance the gain of the tube 55, the suppressure grid 55*c* is connected by a resistor or direct current impedance 101 to ground. This resistor increases the gain of the stage two or three times that of the gain without the resistor 101. This is of particular importance where the tube 55 is operating from the low plate voltage of the automobile battery-generator.

To reduce the distortion a negative feedback circuit is provided in the audio output stages by the connecting line 80 between the output of the transformer 74 and the driver stage 67. A signal 180° out of phase with the signal being supplied from the stage 58 to the control grid 67*a* is applied by line 80 to this control grid and cancels the distortion coming to the grid 67*a* from the stage 58. This minimizes the distortion in the final output of the radio, so that the signals reproduced by speaker 78 are substantially distortion free.

In FIG. 3, there is shown a portion of a radio receiver circuit generally similar to that shown in FIG. 2. However, resistor 104 shown in FIG. 3 connecting suppressor grid 42*b* to the A.V.C. line 91 is in parallel with a resistor 105. Both resistors 104 and 105 are connected to signal ground provided by the A.V.C. line 91. The effect of the resistors 104 and 105 connected to A.V.C. in FIG. 3 is to provide maximum sensitivity at low signal levels and prevents overloading of the subsequent oscillator-mixer stage at high signal levels. The resistor 105 is very large to take care of variations of contact potential of different tubes 42 used in several of the circuits.

The following circuit constants were used in successful examples of the circuit of FIG. 2 described above, and are listed solely for the purposes of illustration and are not intended to limit the invention in any way.

| | | |
|---|---|---|
| Resistor 40 | megohms | 1.5 |
| Resistor 81 | do | 2.2 |
| Resistor 88 | do | 4.7 |
| Resistor 89 | do | 2.2 |
| Resistor 93 | do | 3.3 |
| Resistor 94 | kilohms | 1.5 |
| Resistor 98 | megohms | 91 |
| Resistor 99 | kilohms | 180 |
| Resistor 101 | ohms | 560 |
| Resistor 104 | kilohms | 2.7 |
| Resistor 105 | megohms | 22 |
| Capacitor 31 | microfarads | 100 |
| Capacitor 32 | do | 500 |
| Capacitor 39 | micromicrofarads | 22 |
| Capacitor 41 | do | 90 |
| Capacitor 67 | microfarads | 0.5 |
| Capacitor 75 | do | 200 |
| Capacitor 86 | micromicrofarads | 27 |
| Capacitor 90 | microfarads | .05 |
| Capacitor 96 | do | .05 |

The above-described radio receiver circuits provide maximum gain of the stages when operating at low plate voltage with a minimum of distortion. At low level signals, the automatic volume control voltage applied to the stage 42 is adjusted through the bleeder connection to the positive potential so that maximum sensitivity is provided, while at the higher signal levels, the automatic volume control voltage reduces the gain of the radio frequency stage 42. The A.V.C. applied to the stage 55, where high gain is sought, is proportional to the signal strength throughout. This gain of the stage 55 is enhanced by the effect of the resistor 101 connected between the suppressor grid 55*c* and the cathode of the tube 55. The resistor 94 connected to the suppressor grid 42*b* of the radio frequency amplifier stage 42 causes the stage to operate without distortion even when the received signals are at very high signal levels. The automatic volume control action on the audio amplifier tube 58 further holds the receiver output within very narrow limits for wide ranges of received signals.

I claim:

1. In a superheterodyne radio receiver, a radio frequency amplifier vacuum tube having a control grid and a suppressor grid, an intermediate frequency amplifier vacuum tube having a control grid and a suppressor grid, an automatic volume control circuit having a diode with an anode and developing automatic volume control voltage at said anode from the output of the intermediate frequency amplifier tube, said automatic volume control circuit including a voltage divider connected to said anode and having an intermediate point connected to said control grid of said intermediate frequency amplifier tube, a direct current impedance connecting said suppressor grid of said intermediate frequency amplifier tube to a reference voltage point and constituting the only connection to said suppressor grid, a first resistor, a bleeder resistor, a positive power supply terminal, a series circuit including said bleeder resistor and said first resistor connecting said positive power supply terminal to said anode of said diode for reducing the negative potential at said anode to hold said anode at a small negative potential in the absence of signals causing current flow through said diode, means including a third resistor connecting the junction point of said first resistor and said bleeder resistor to the suppressor grid of the radio frequency amplifier tube, and a fourth resistor connected between said junction point and said signal grid of said radio frequency amplifier tube.

2. In a superheterodyne radio receiver, a radio frequency amplifier vacuum tube having a control grid and a suppressor grid, an intermediate frequency amplifier vacuum tube having a control grid and a suppressor grid, an audio frequency amplifier vacuum tube having a control grid, an automatic volume control circuit including a first diode with an anode, means coupling said anode to the output of said intermediate frequency amplifier tube for developing an automatic volume control voltage at said anode, a first resistor, a second bleeder resistor, a positive power supply terminal, a series circuit including said bleeder resistor and said first resistor connecting said positive power supply terminal to said anode of said diode for reducing the negative potential at said anode to hold said anode at a small negative potential in the absence of signals causing current flow through said diode, means including a third resistor connecting the junction point of said first resistor and said bleeder resistor to the suppressor grid of said radio frequency amplifier tube, a fourth resistor connected between said junction point and said signal grid of said radio frequency amplifier tube, a voltage divider connected to said anode and having an intermediate point thereof connected to said control grid of said intermediate frequency amplifier tube, a direct current impedance connecting said suppressor grid of said intermediate frequency amplifier tube to a reference voltage point, a second diode having an anode, means coupling said second diode to the output of said intermediate frequency amplifier tube, filter means connected to said anode of said second diode for developing a second automatic volume control voltage, and means connecting said filter means to said control grid of said audio amplifier tube to apply said second volume control voltage thereto.

3. In a superheterodyne radio receiver, a radio frequency amplifier vacuum tube having a control grid and a suppressor grid, an intermediate frequency amplifier vacuum tube having a control grid and a suppressor grid, an audio frequency amplifier vacuum tube having a control grid, an automatic volume control circuit including a first diode with an anode, means coupling said anode to the output of said intermediate frequency amplifier tube for developing an automatic volume control voltage at said anode, first filter means connected to said anode of said diode for developing a gain control voltage, a first resistor connecting said filter to the suppressor grid of said radio frequency amplifier tube, a second resistor connecting said filter to said signal grid of said radio frequency amplifier tube, a voltage divider connected to said anode and having an intermediate point thereof connected to said control grid of said intermediate frequency amplifier tube, a direct current impedance connecting said suppressor grid of said intermediate frequency amplifier tube to a reference voltage point and constituting the only connection to said suppressor grid, a second diode having an anode, means coupling said anode of said second diode to the output of said second intermediate frequency amplifier tube, second filter means connected to said anode of said second diode for developing a second automatic volume control voltage, and means connecting said second filter means to said control grid of said audio amplifier tube to apply said second volume control voltage thereto.

4. In a low voltage radio receiver, a radio frequency amplifier stage, an intermediate frequency amplifier stage having an output, an audio frequency amplifier stage, an automatic volume control circuit for developing a gain reducing voltage from the signal in said second amplifier stage, said automatic volume control circuit including a first diode having an anode coupled to said output of said intermediate frequency amplifier stage, with said anode producing a negative voltage in the absence of an applied signal through contact potential action and producing a negative voltage in response to signals applied from said output of said intermediate frequency stage which increases with the strength of such signals, means including a bleeder resistor for supplying positive voltage to said anode of said diode for reducing the negative potential on said anode so that said anode is slightly negative in the absence of signals in said intermediate frequency stage, resistance means connecting said radio frequency stage to said volume control circuit for controlling the gain thereof, a voltage-divider in the automatic volume control circuit having an intermediate point connected to said intermediate frequency amplifier stage for controlling the gain thereof, a second diode having an anode coupled to said output of said intermediate frequency amplifier stage, means coupled to said anode of said second diode and to said audio frequency amplifier stage for applying a control voltage thereto for controlling the gain thereof.

5. In a low voltage radio receiver, a radio frequency amplifier stage having a vacuum tube with control and suppressor grids, an intermediate frequency amplifier stage having a vacuum tube with control and suppressor grids and an output electrode, an audio frequency vacuum tube amplifier stage, an automatic volume control circuit for developing a gain reducing voltage from the signal in said second amplifier stage, said automatic volume control circuit including a first diode having an anode coupled to said output of said intermediate frequency amplifier stage, with said anode producing a negative voltage in the absence of an applied signal through contact potential action and producing a negative voltage in response to signals applied from said output of said intermediate frequency stage which increases with the strength of such signals, means including a bleeder resistor for supplying positive voltage to said anode of said diode for reducing the negative potential on said anode so that said anode is slightly negative in the absence of signals in said intermediary frequency stage, resistance means connecting said control grid of said vacuum tube of said radio frequency stage to the volume control circuit for controlling the gain thereof, a voltage-divider in the automatic volume control circuit having an intermediate point connected to said control grid of said vacuum tube of said intermediate frequency amplifier stage for controlling the gain thereof, first and second direct current impedance means individually connecting said suppressor grids of said radio frequency stage and said intermediate frequency stage to a reference point for radio frequency and intermediate frequency signals, a second diode having an anode coupled to said output of said intermediate frequency amplifier stage, means coupled to said anode of said second diode and to said audio frequency amplifier stage for applying a control voltage thereto for controlling the gain thereof.

6. In a low voltage radio receiver, a radio frequency amplifier stage, a second vacuum tube amplifier stage having an output, an automatic volume control circuit for developing a gain reducing voltage from the signal in said second amplifier stage, said automatic volume control circuit including a diode having an anode coupled to said output of said second amplifier stage with said anode producing a negative voltage in the absence of an applied signal through contact potential action and producing a negative voltage in response to signals applied from said output of said second stage which increases with the strength of such signals, means including a bleeder resistor for supplying positive voltage to said anode of said diode for reducing the negative potential on said anode so that said diode is slightly negative in the absence of signals in said second stage, resistance means connecting the radio frequency stage to the volume control circuit for controlling the gain thereof, and a voltage-divider in the automatic volume control circuit having an intermediate point connected to said second amplifier stage for controlling the gain thereof.

7. In a low voltage radio receiver for use in an automobile and to be energized directly from the electrical system of the automobile, a radio frequency amplifier stage having a control grid, an intermediate frequency amplifier stage having a control grid and an output electrode, potential supply means connected to said stages for energizing the same, an automatic volume control circuit for developing a gain reducing voltage from the signal in said intermediate frequency amplifier stage, said automatic volume control circuit including a diode having an anode coupled to said output electrode of said intermediate frequency amplifier stage, a first circuit portion including series resistance means and shunt capacitor means connecting said diode to said control grid of said radio frequency amplifier stage for applying a potential thereto to control the gain thereof, said automatic volume control circuit including a voltage-divider circuit portion connected between said first circuit portion and a reference potential and having an intermediate point thereon connected to said control grid of said intermediate frequency amplifier stage for applying a potential thereto to control the gain thereof, said anode of said diode producing through contact potential action a negative voltage in the absence of an applied signal from said intermediate frequency amplifier stage, and producing a further negative voltage in response to signals applied from said output of said intermediate frequency amplifier stage and which further voltage increases with the strength of such signals, and means including resistor means connecting said potential supply means to said automatic volume control circuit for supplying positive voltage to said anode of said diode for reducing the negative voltage on said anode produced through contact potential action so that said anode of said diode is slightly negative in the absence of a signal at the output of said intermediate frequency amplifier stage.

8. In a radio receiver a radio frequency stage, an intermediate frequency amplifier stage having an output, potential supply means connected to said stages for energizing the same, an automatic volume control circuit for developing a gain reducing voltage from the signal in said intermediate frequency amplifier stage, said automatic volume control circuit including a diode having an anode coupled to said output of said intermediate frequency amplifier stage, a first circuit portion including resistor means connecting said diode to said radio frequency stage for applying a potential thereto to control the gain thereof, said automatic volume control circuit including a second circuit portion including voltage-divider resistor means connected from said first circuit portion to a reference potential and having an intermediate point thereon connected to said intermediate frequency amplifier stage for applying a potential thereto to control the gain thereof, said anode of said diode producing through contact potential action a negative voltage in the absence of an applied signal from said intermediate frequency amplifier stage, and producing a further negative voltage in response to signals applied from said output of said intermediate frequency amplifier stage and which further voltage increases with the strength of such signals, and a third circuit portion including resistor means connecting said potential supply means to said automatic volume control circuit for supplying positive voltage to said anode of said diode for reducing the negative voltage on said anode produced through contact potential action so that said anode of said diode is slightly negative in the absence of a signal at the output of said intermediate frequency amplifier stage.

References Cited in the file of this patent

UNITED STATES PATENTS

| | | |
|---|---|---|
| 2,013,121 | Wheeler | Sept. 3, 1935 |
| 2,088,230 | Burnside | July 27, 1937 |
| 2,133,795 | Barton | Oct. 18, 1938 |
| 2,172,160 | Dome | Sept. 5, 1939 |
| 2,207,094 | Getaz | July 9, 1940 |
| 2,220,770 | Mayer | Nov. 5, 1940 |
| 2,488,606 | Sands | Nov. 22, 1949 |
| 2,731,558 | Anthun | Jan. 17, 1956 |
| 2,750,451 | Crow | June 12, 1956 |
| 2,810,071 | Race | Oct. 15, 1957 |
| 2,834,877 | Milwitt | May 13, 1958 |
| 2,873,361 | Peperberg | Feb. 10, 1959 |